(12) United States Patent
Lee

(10) Patent No.: US 8,518,285 B2
(45) Date of Patent: Aug. 27, 2013

(54) SUBSTRATE SECTION FOR FLEXIBLE DISPLAY DEVICE, METHOD OF MANUFACTURING THE SUBSTRATE SECTION, AND METHOD OF MANUFACTURING ORGANIC LIGHT EMITTING DISPLAY DEVICE INCLUDING THE SUBSTRATE

(75) Inventor: Dong-Beom Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 366 days.

(21) Appl. No.: 12/764,758

(22) Filed: Apr. 21, 2010

(65) Prior Publication Data
US 2011/0139747 A1    Jun. 16, 2011

(30) Foreign Application Priority Data
Dec. 15, 2009  (KR) .................. 10-2009-0125025

(51) Int. Cl.
*C03C 15/00*   (2006.01)
(52) U.S. Cl.
USPC ............... 216/83; 216/24; 313/511; 349/122; 438/8; 438/37; 438/41; 524/157; 524/167; 524/183; 524/185; 524/588
(58) Field of Classification Search
USPC ................ 216/24, 83; 313/511; 349/122; 428/8, 37, 41, 317.3; 524/588, 157, 167, 524/183, 185, 319
See application file for complete search history.

(56) References Cited

U.S. PATENT DOCUMENTS

| 7,956,351 | B2* | 6/2011 | Choi ................. 257/40 |
| 2004/0135503 | A1* | 7/2004 | Handa et al. .......... 313/511 |
| 2008/0002118 | A1* | 1/2008 | Paek et al. ........... 349/122 |
| 2009/0261062 | A1* | 10/2009 | Kim ..................... 216/24 |
| 2010/0038023 | A1 | 2/2010 | Kho et al. |

FOREIGN PATENT DOCUMENTS

| JP | 2004111158 | 8/2004 |
| JP | 2007090803 | 4/2007 |
| KR | 20030032294 | 4/2003 |
| KR | 20070096278 | 10/2007 |
| KR | 20080001744 | 1/2008 |
| KR | 20090110097 | 10/2009 |

OTHER PUBLICATIONS

Korean Office Action dated May 16, 2011 in Korean Priority Application No. 10-2010-0008016.

* cited by examiner

*Primary Examiner* — Lan Vinh
*Assistant Examiner* — Maki Angadi
(74) *Attorney, Agent, or Firm* — Knobbe Martens Olson & Bear LLP

(57) ABSTRACT

A substrate section for a flexible display device is disclosed. The substrate section includes: a first substrate, a second substrate disposed above a center region of the first substrate, a reinforcing layer disposed between the first and second substrates, configured to reinforce adhesion between the first and second substrates, and a barrier layer disposed above the second substrate and surrounding side surfaces of the second substrate and of the reinforcing layer.

11 Claims, 4 Drawing Sheets

SUBSTRATE SECTION FOR FLEXIBLE DISPLAY DEVICE, METHOD OF MANUFACTURING THE SUBSTRATE SECTION, AND METHOD OF MANUFACTURING ORGANIC LIGHT EMITTING DISPLAY DEVICE INCLUDING THE SUBSTRATE

CROSS-REFERENCE TO RELATED APPLICATIONS

This application claims the benefit of Korean Patent Application No. 10-2009-0125025, filed on Dec. 15, 2009, in the Korean Intellectual Property Office, the disclosure of which is incorporated herein in its entirety by reference.

BACKGROUND

1. Field

The field relates to a substrate section for a flexible display device, and a method of manufacturing the substrate section.

2. Description of the Related Technology

Flexible displays are produced on a thin substrate formed of plastic or the like, and are not damaged even when folded or rolled. Flexible displays are produced by using a liquid crystal display (LCD) or an organic light emitting display (OLED), wherein the LCD or OLED includes a thin film transistor (TFT).

Panels of flexible displays are formed by coating plastic on a support substrate, depositing a barrier on the plastic-coated support substrate, forming a backplane, and then performing a thin film encapsulation (TFE) process. In the flexible displays, a thick organic pixel defined layer is generally used, and a thick passivation layer is generally formed during the TFE process, for planarization by using an organic layer of the passivation layer. The plastic is then removed from the support substrate, and a protective film is attached to the top and bottom surfaces of the support substrate.

SUMMARY OF CERTAIN INVENTIVE ASPECTS

One aspect is a substrate section for a flexible display device, the substrate section including: a first substrate, a second substrate disposed above a center region of the first substrate, a reinforcing layer disposed between the first and second substrates, configured to reinforce adhesion between the first and second substrates, and a barrier layer disposed above the second substrate and surrounding side surfaces of the second substrate and of the reinforcing layer.

Another aspect is a method of manufacturing a substrate section for a flexible display device, the method including: preparing a first substrate configured to have at least one smooth surface, forming a reinforcing layer above the first substrate, forming a second substrate above the reinforcing layer, where the second substrate is configured to be flexible, and forming a barrier layer configured to cover a top surface of the second substrate and side surfaces of the reinforcing layer and of the second substrate.

Another aspect is a method of manufacturing an organic light emitting display device, the method including: preparing a first substrate configured to have at least one smooth surface, forming a reinforcing layer above the first substrate, forming a second substrate above the reinforcing layer, where the second substrate is configured to be flexible, forming a barrier layer configured to cover a top surface of the second substrate and surrounding side surfaces of the reinforcing layer and of the second substrate, forming an organic light emitter on the barrier layer, forming an encapsulation layer for sealing the organic light emitter, and removing the first substrate and the reinforcing layer.

BRIEF DESCRIPTION OF THE DRAWINGS

The above and other features will become more apparent by describing in detail exemplary embodiments with reference to the attached drawings in which.

DETAILED DESCRIPTION OF CERTAIN INVENTIVE EMBODIMENTS

Figure 1:
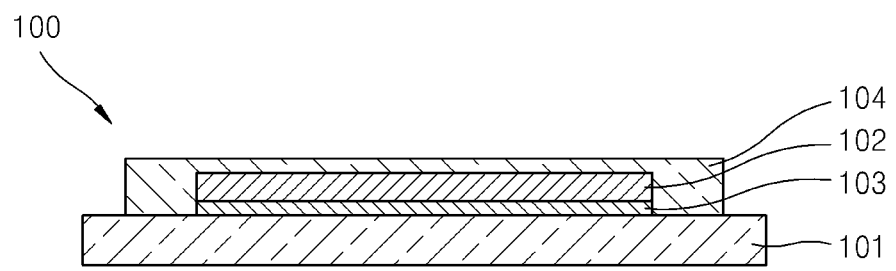
FIG. 1 shows a schematic cross-sectional view of a substrate section for a flexible flat panel display device, according to one embodiment of the present invention.

In the following detailed description, certain exemplary embodiments have been shown and described, simply by way of illustration. As those skilled in the art would realize, the described embodiments may be modified in various ways without departing from the spirit or scope of the present invention. Accordingly, the drawings and description are to be regarded as illustrative in nature and not restrictive. Like reference numerals generally designate like elements throughout the specification.

Figure 2:
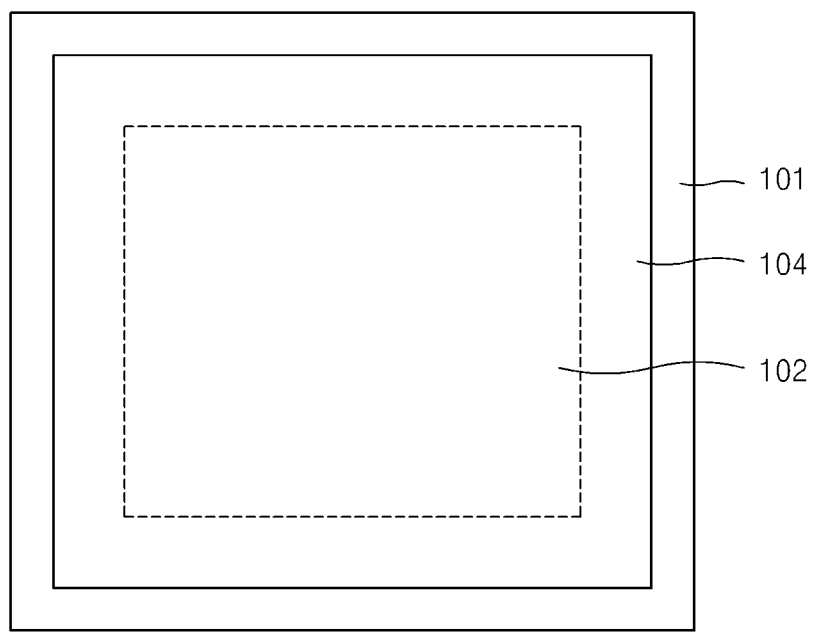
FIG. 2 shows a schematic plan view of the substrate section of FIG. 1.

FIG. 1 shows a schematic cross-sectional view of a substrate section 100 for a flexible flat panel display device, according to one embodiment, and FIG. 2 shows a schematic plan view of the substrate section 100 of FIG. 1.

Referring to FIGS. 1 and 2, the substrate section 100 may include a first substrate 101, a reinforcing layer 103, a second substrate 102, and a barrier layer 104.

The first substrate 101 may have at least one smooth surface. The reinforcing layer 103 and the second substrate 102 may be sequentially stacked above the smooth surface of the first substrate 101. The first substrate 101 may be formed of glass.

The reinforcing layer 103 is formed above the smooth surface of the first substrate 101, and disposed between the first and second substrates 101 and 102. As shown in FIG. 2, the reinforcing layer 103 and the second substrate 102 are disposed only in a center region of the first substrate 101 and not in edge regions of the first substrate 101.

The second substrate 102 is formed of a ductile synthetic resin, and if disposed directly on the first substrate 101 it may get detached from the first substrate 101 due to poor adhesion characteristics between glass and synthetic resin. Accordingly, a reinforcing layer 103 is disposed between the first and second substrates 101 and 102 to increase the adhesion characteristic between the first and second substrates 101 and 102. Thus, the second substrate 102 may be prevented from being detached from the first substrate 101. The reinforcing layer 103 may be formed of an indium tin oxide (ITO), and deposited onto the first substrate 101.

A barrier layer 104 may be formed above the second substrate 102. The barrier layer 104 may be formed above the first substrate 101 by covering a top surface of the second substrate 102 while surrounding side surfaces of the second substrate 102 and side surfaces of the reinforcing layer 103. One embodiment of an organic light emitter 110, such as that shown in FIG. 8, may be formed above the barrier layer 104. The barrier layer 104 prevents impurities, such as oxygen, moisture, or the like, from penetrating into the organic light emitter 110 through the first and second substrates 101 and 102. In one embodiment, the barrier layer 104 may be formed of an inorganic material. In other embodiments, the barrier layer 104 may be formed of a plurality of inorganic layers. In yet other embodiments, the barrier layer 104 may be formed by alternately stacking a silicon oxide (SiOx) layer and a silicon nitride (SiNx) layer. In some embodiments, the barrier layer 104 may be formed by using a plasma enhanced chemical vapor deposition (PECVD) process.

FIGS. 3 through 7 show cross-sectional views of the substrate of FIG. 1 during manufacturing, according to an embodiment.

Figure 3:
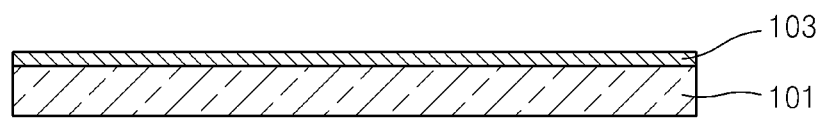
FIGS. 3 through 7 show cross-sectional views of the substrate section of FIG. 1 during manufacturing, according to one embodiment.

FIG. 3 shows the first substrate 101 with at least one smooth surface, and the reinforcing layer 103 coated on the smooth surface of the first substrate 101. The first substrate 101 may be formed of glass. The reinforcing layer 103 may be formed by depositing an ITO on the first substrate 101.

Figure 4:
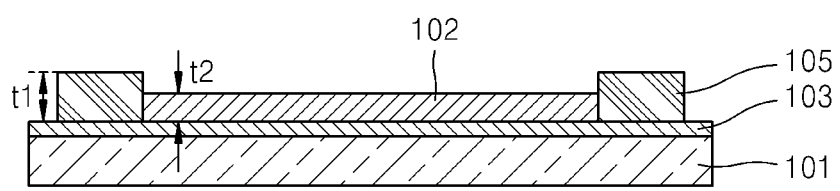

Next, referring to FIG. 4, a barrier rib 105 above the edge regions of the reinforcing layer 103 is formed. The barrier rib 105 is not formed above the center region of the reinforcing layer 103. The second substrate 102 is formed above the center region of the reinforcing layer 103 and is surrounded by the barrier rib 105. The second substrate 102 may be formed of a ductile synthetic resin. The second substrate 102 is formed by using a spin coating method. The barrier rib 105 has a height t1 which is greater than the height t2 of the second substrate 102. The barrier rib 105 prevents the ductile synthetic resin forming the second substrate 102 from flowing over the barrier rib 105 while the second substrate 102 is formed. The barrier rib 105 may be formed of a poly-ethylene terephthalate (PET) film.

Figure 5:
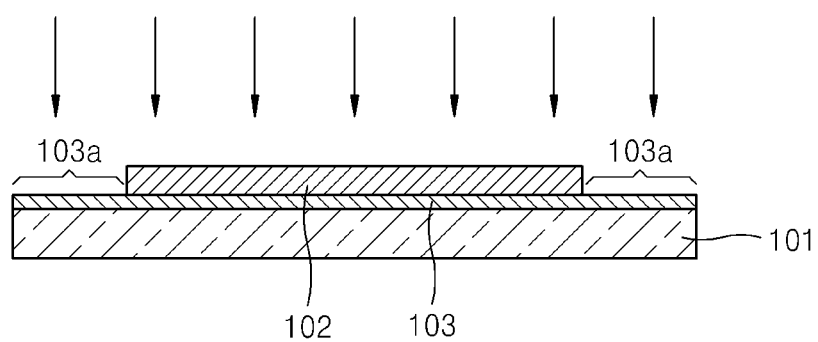

Referring to FIG. 5, the barrier rib 105 is removed after the second substrate 102 is formed. Portions 103a of the reinforcing layer 103 are also removed. The portions 103a of the reinforcing layer 103 are those portions which are not covered by the second substrate 102. The portions 103a may be removed via etching. For example, the portions 103a may be removed via wet-etching. When removing the portions 103a, the portions 103a may be selectively etched, and the second substrate 102 may not be etched. The portions 103a may be selectively etched according to an etchant used. In one embodiment, the portions 103a may be etched by using an etchant that has a higher etch rate on the portions 103a than the etchant used on the second substrate 102.

Figure 6:
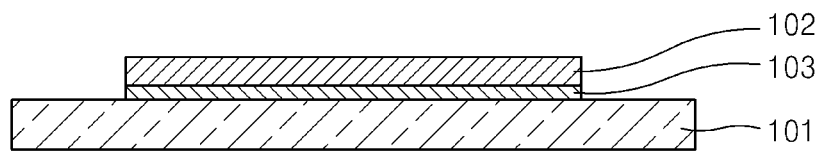

FIG. 6 shows a cross-sectional view of the substrate section 100 from which the portions 103a are removed. Referring to FIG. 6, the reinforcing layer 103 and the second substrate 102 are stacked above the first substrate 101, and the reinforcing layer 103 and the second substrate 102 are not formed on the edge regions of the first substrate 101.

Using convention methods of manufacturing, the barrier rib 105 is generally removed by using photolithography. However, conventional photolithography involves complex processes (coating of a photoresist, exposing to light, and developing, for example) and additional costs. In addition, the portions 103a may not be completely removed with such conventional photolitography, and thus a peel-off phenomenon may occur if the portions 103a are left on the first substrate, i.e., the barrier layer 104 and the first substrate 101 may be separated from each other.

According to one embodiment of the present invention, the portions 103a of the reinforcing layer 103 are removed via etching instead of photolithography, and thus processes of removing the portions 103a are simplified, manufacturing costs are reduced, and a peel-off phenomenon is prevented.

Figure 7:
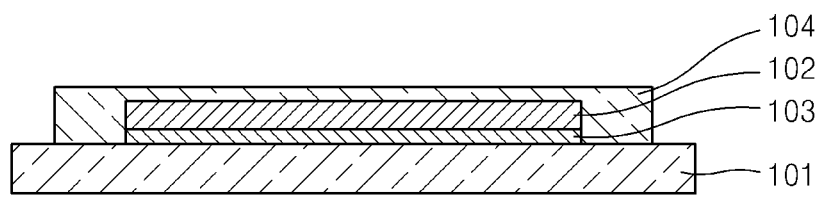

As shown in FIG. 7, the barrier layer 104 is coated over the entire top surface of the second substrate 102, and is also coated on the edge regions of the first substrate 101 to cover the side surfaces of the second substrate 102 and the side surfaces of the reinforcing layer 103. The barrier layer 104 prevents impurities, such as oxygen, moisture, or the like, from penetrating into the organic light emitter 110 through the first and second substrates 101 and 102.

In one embodiment, the barrier layer 104 may be formed of an inorganic material. In other embodiments, the barrier layer 104 may be formed of a plurality of inorganic layers. In yet other embodiments, the barrier layer 104 may be formed by alternately stacking a silicon oxide (SiOx) layer and a silicon nitride (SiNx) layer. In some embodiments, the barrier layer 104 may be formed by using a PECVD method.

Figure 8:
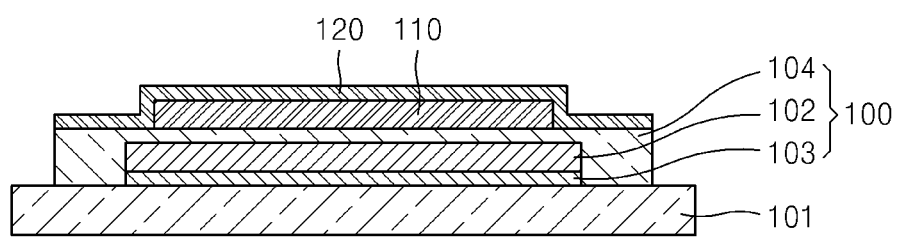
FIGS. 8 through 10 show cross-sectional views of an embodiment of manufacturing an organic light emitting display device by incorporating an embodiment of the substrate section of FIG. 1.
Figure 9:
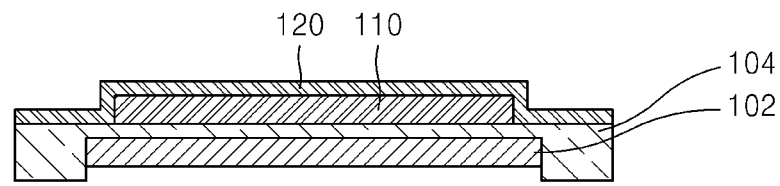
Figure 10:
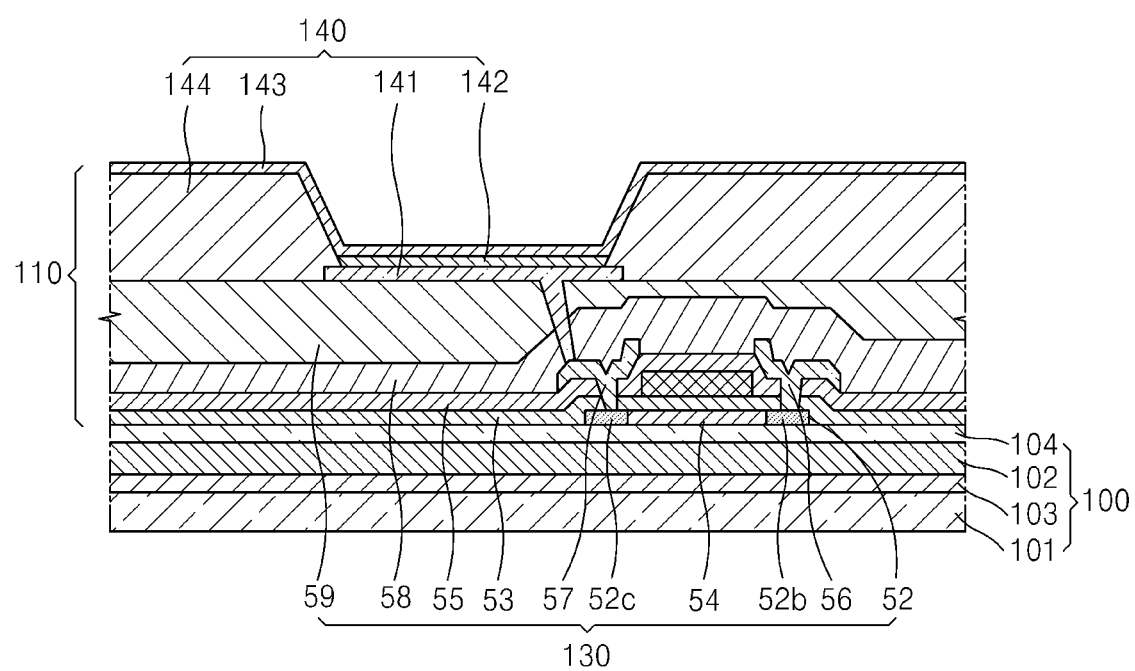

FIGS. 8 through 10 show cross-sectional views of an embodiment of manufacturing an organic light emitting display device by incorporating an embodiment of the substrate of FIG. 1.

One embodiment of the substrate section 100 is prepared as described above, and as shown in FIG. 8, the organic light emitter 110 and an encapsulation layer 120 are formed above the barrier layer 104.

One embodiment of the organic light emitter 110 may include a pixel circuit 130 and an organic light emitting device 140. The organic light emitter 110 is formed by sequentially forming the pixel circuit 130 and the organic light emitting device 140 above the barrier layer 104. In one embodiment, the pixel circuit 130 may be a thin film transistor (TFT).

Referring to FIG. 10, an active layer 52 is formed above the barrier layer 104 of the substrate section 100. A gate insulating layer 53 is formed above the active layer 52, and a gate electrode 54 is formed above a region of the gate insulating layer 53. The gate electrode 54 is connected to a gate line (not shown) that applies a TFT ON/OFF signal. An interlayer insulating layer 55 is formed above the gate electrode 54. Source and drain electrodes 56 and 57 are formed, each contacting source region 52b and drain region 52c, respectively, of the active layer 52, through contact holes. An insulating layer 58 is formed above the source and drain electrodes 56 and 57. The insulating layer 58 may be a passivation layer formed of SiO2 or SiNx. A planarization layer 59 is formed of an organic material, such as acryl, polyimide, benzocyclobutene (BCB), and the like, above the insulating layer 58.

A pixel electrode 141 functions as an anode of the organic light emitting display device, and is formed above the planarization layer 59. A pixel defining layer 144, formed of an organic material, is formed to cover the pixel electrode 141. An opening is formed in the pixel defining layer 144, and an intermediate layer 142 is formed above the pixel defining layer 144. The intermediate layer 142 is also formed above the pixel electrode 141, and is exposed through an opening of the pixel defining layer 144. The intermediate layer 142 includes an emissive layer. The structure of the organic light emitting display device is not limited to the embodiment above, Any of various structures of organic light emitting display devices may be used in other embodiments.

The organic light emitting device 140 displays image information by emitting red, green, and blue light according to a flow of current. The organic light emitting device 140 includes the pixel electrode 141, which is connected to the drain electrode 56 of the pixel circuit 130, and to which is applied a positive power voltage. The organic light emitting device 140 also includes a counter electrode 143, which is formed to cover the entire pixel defining layer 144 and the intermediate layer 142, and to which is applied a negative power voltage. The organic light emitting device 140 also includes the intermediate layer 142, which is disposed between the pixel electrode 141 and the counter electrode 143, and emits light.

The pixel electrode 141 and the counter electrode 143 are insulated from each other by the intermediate layer 142, and apply voltages of opposite polarities to the intermediate layer 142 to induce light emission in the intermediate layer 142. The intermediate layer 142 may include a low-molecular weight organic layer or a high-molecular weight organic layer. In embodiments using a low-molecular weight organic layer, the intermediate layer 142 may have a single or multi-layer structure including at least one selected from the group consisting of a hole injection layer (HIL), a hole transport layer (HTL), an emission layer (EML), an electron transport layer (ETL), and an electron injection layer (EIL). The low-molecular weight organic layer may be formed of an organic material. Examples of available organic materials include copper phthalocyanine (CuPc), N,N'-di(naphthalene-1-yl)-N,N'-diphenyl-benzidine (NPB), and tris-8-hydroxyquino-line aluminum (Alq3). The low-molecular weight organic layer may be formed by vacuum deposition.

In embodiments using a high-molecular weight organic layer, the intermediate layer 142 may have a structure including a HTL and an EML. The HTL may be formed of poly (ethylenedioxythiophene) (PEDOT), and the EML may be formed of polyphenylenevinylenes (PPVs) or polyfluorenes. The HTL and the EML may be formed by screen printing, inkjet printing, or the like.

The intermediate layer 142 is not limited to the organic layers described above, and may be embodied in various other ways.

The intermediate layer 142 may be formed by using a spin coating method. An organic material is coated on the pixel electrode 141 and the pixel defining layer 144 to cover the pixel electrode 141 and the pixel defining layer 144. The substrate section 100 is then spun. The organic material coated on the pixel defining layer 144 is removed and only the organic material coated on the pixel electrode 141 is left, due to the spinning of the substrate section 100. Next, the organic material coated on the pixel electrode 141 is plasticized so as to form the intermediate layer 142.

In one embodiment, the pixel electrode 141 functions as an anode, and the counter electrode 143 functions as a cathode. In other embodiments, the pixel electrode 141 may function as a cathode, and the counter electrode 143 may function as an anode.

The pixel electrode 141 may be formed as a transparent electrode or a reflective electrode. A transparent electrode may be formed of indium tin oxide (ITO), indium zinc oxide (IZO), zinc oxide (ZnO), or indium oxide (In2O3). A reflective electrode may be formed by forming a reflective layer formed of silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or In2O3 above the reflective layer.

The counter electrode 143 may be formed as a transparent electrode or a reflective electrode. In embodiments where the counter electrode 143 is formed as a transparent electrode, the counter electrode 143 functions as a cathode. A transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, above the intermediate layer 142 and forming an auxiliary electrode layer or a bus electrode line thereon by using a transparent electrode forming material, such as ITO, IZO, ZnO, In2O3, or the like. In embodiments where the counter electrode 143 is formed as a reflective electrode, the reflective electrode may be formed by depositing Li, Ca, LiF/Ca, LiF/Al, Al, Ag, Mg, or a compound thereof on the entire surface of the intermediate layer 142 and the pixel defining layer 144.

Once the organic light emitter 110 is formed, it is sealed by using an encapsulation layer 120. In one embodiment, the encapsulation layer 120 may be formed by alternately stacking a thin organic layer and a thin inorganic layer. In other embodiments, the encapsulation layer 120 may be formed of a metal layer.

As shown in FIG. 9, a delamination process of separating the first and second substrates 101 and 102 is then performed. Laser beam irradiation, chemical dissolution, or the like is performed depending on the material used to form the reinforcing layer 103, so as to remove the reinforcing layer 103, thereby separating the first and second substrate 101 and 102 from each other.

According to embodiments of the present invention, a peel-off phenomenon between a barrier layer and a first substrate may be prevented during the manufacturing process.

While this disclosure has been described with reference to certain exemplary embodiments, it will be understood by those of ordinary skill in the art that various changes in form and details may be made.

What is claimed is:

1. A method of manufacturing a substrate section for a flexible display device, the method comprising:
    preparing a first substrate configured to have at least one smooth surface;
    forming a reinforcing layer above the first substrate;
    forming a barrier rib on an edge region of the reinforcing layer;
    forming a second substrate above only a center region of the reinforcing layer and not on the edge region, wherein the second substrate is surrounded by the barrier rib;
    removing the barrier rib; and
    removing portions of the edge region of the reinforcing layer, wherein the second substrate is not formed on the portions of the edge region; and
    forming a barrier layer configured to cover a top surface of the second substrate and side surfaces of the reinforcing layer and of the second substrate, such that the barrier layer covering only an area of the first substrate exposed by removing the portions of the edge region of the reinforcing layer.

2. The method of claim 1, wherein the first substrate is formed of glass.

3. The method of claim 1, wherein the reinforcing layer is configured to reinforce adhesion between the first and second substrates.

4. The method of claim 3, wherein the reinforcing layer is formed by depositing indium tin oxide (ITO) on the first substrate.

5. The method of claim 1, wherein the second substrate is formed of a ductile synthetic resin.

6. The method of claim 1, wherein the barrier layer is formed of an inorganic material.

7. The method of claim 1, wherein the second substrate is formed by using a spin coating method.

8. The method of claim 1, wherein the portions are removed via etching.

9. The method of claim 8, wherein the portions are removed via wet-etching.

10. The method of claim 9, wherein an etchant used on the reinforcing layer has an etch rate higher than that of the etchant used on the second substrate.

11. A method of manufacturing an organic light emitting display device, the method comprising:
- preparing a first substrate configured to have at least one smooth surface;
- forming a reinforcing layer above the first substrate;
- forming a barrier rib on an edge region of the reinforcing layer;
- forming a second substrate above only a center region of the reinforcing layer and not on the edge region, wherein the second substrate is surrounded by the barrier rib;
- removing the barrier rib;
- removing portions of the edge region of the reinforcing layer, wherein the second substrate is not formed on the portions of the edge region;
- forming a barrier layer configured to cover a top surface of the second substrate and side surfaces of the reinforcing layer and of the second substrate, the barrier layer covering only an area of the first substrate exposed by removing the portions of the edge region of the reinforcing layer;
- forming an organic light emitter on the barrier layer;
- forming an encapsulation layer for sealing the organic light emitter; and
- removing the first substrate and the reinforcing layer.

* * * * *

UNITED STATES PATENT AND TRADEMARK OFFICE
CERTIFICATE OF CORRECTION

PATENT NO. : 8,518,285 B2  Page 1 of 1
APPLICATION NO. : 12/764758
DATED : August 27, 2013
INVENTOR(S) : Dong-Beom Lee It is certified that error appears in the above-identified patent and that said Letters Patent is hereby corrected as shown below:

In the Claims:

At column 6, line 44, Claim 1, after "rib;" delete "and".

At column 6, line 50, Claim 1, after "substrate," delete "such that".

Signed and Sealed this
Tenth Day of June, 2014

Michelle K. Lee
*Deputy Director of the United States Patent and Trademark Office*